United States Patent [19]

Grohmann

[11] 4,009,438
[45] Feb. 22, 1977

[54] SUPERHETERODYNE RECEIVER WITH A DIGITALLY ADJUSTABLE TUNING ARRANGEMENT

[75] Inventor: Lothar Grohmann, Pforzheim, Germany

[73] Assignee: International Standard Electric Corporation, New York, N.Y.

[22] Filed: June 20, 1974

[21] Appl. No.: 481,031

[30] Foreign Application Priority Data

July 3, 1973  Germany ............ 2333852

[52] U.S. Cl. .................. 325/421; 325/469
[51] Int. Cl.² .......................... H04B 1/26
[58] Field of Search .......... 325/419, 420, 421, 422, 325/469, 470; 331/177 R, 178; 334/15, 16, 18, 26

[56] References Cited

UNITED STATES PATENTS

| | | | |
|---|---|---|---|
| 3,163,823 | 12/1964 | Kellis et al. | 325/421 |
| 3,189,829 | 6/1965 | Bento et al. | 325/470 |
| 3,372,339 | 3/1968 | Harrison et al. | 325/421 |
| 3,492,584 | 1/1970 | Takahashi | 325/335 |
| 3,631,349 | 12/1971 | Rhee | 325/470 |

*Primary Examiner*—Benedict V. Safourek
*Attorney, Agent, or Firm*—John T. O'Halloran; Peter C. Van Der Sluys; Vincent Ingrassia

[57] ABSTRACT

The invention provides a superheterodyne receiver having a digitally adjustable tuning arrangement which permits wide adjustable frequency ranges and in which nearly no deviation from the adjusted frequency occurs over the entire adjustable frequency range.

3 Claims, 6 Drawing Figures

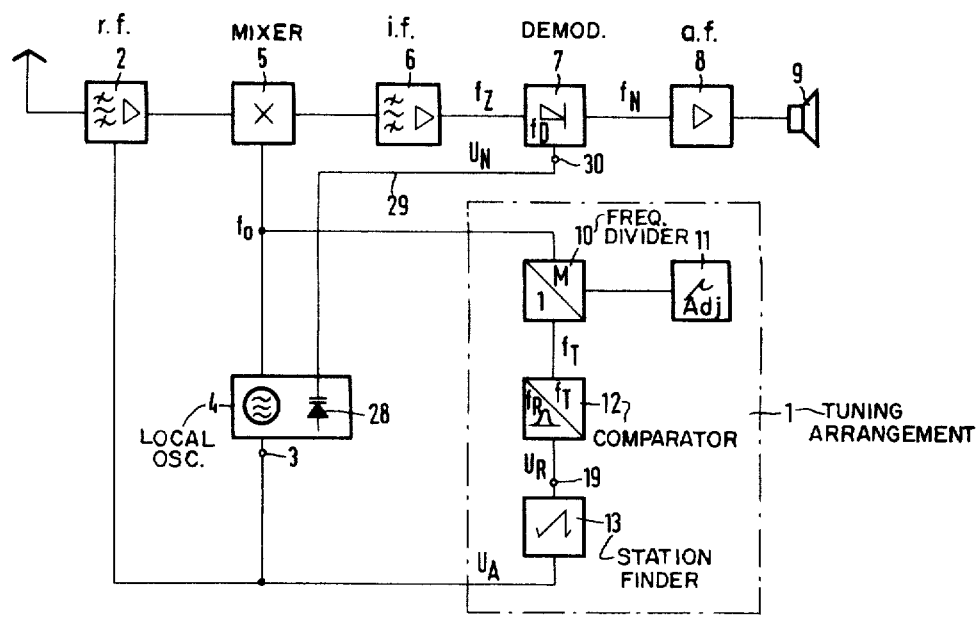
Fig.4
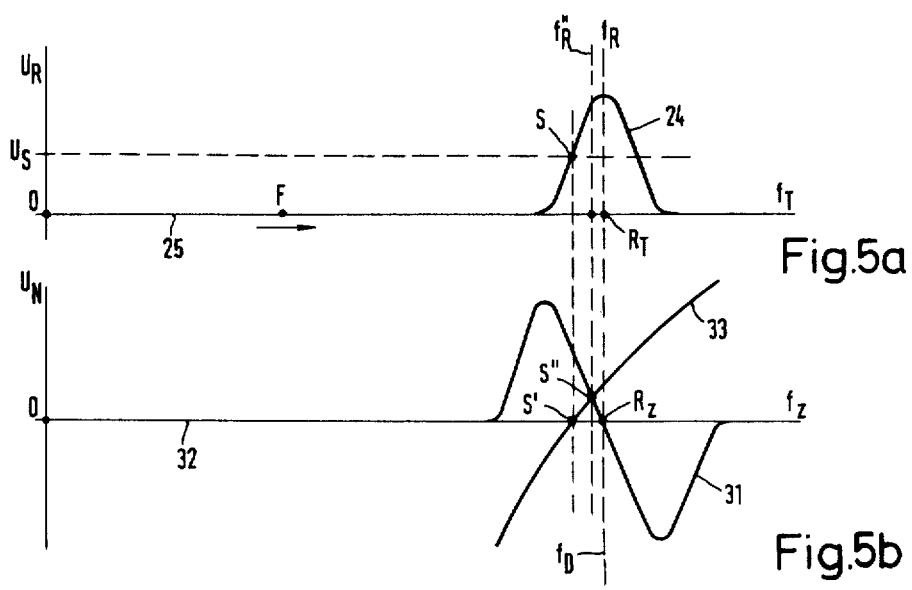
Fig.5a
Fig.5b

SUPERHETERODYNE RECEIVER WITH A DIGITALLY ADJUSTABLE TUNING ARRANGEMENT

BACKGROUND OF THE INVENTION

The present invention relates to a superheterodyne receiver with an information-transmission circuit, a local oscillator tunable with a dc voltage, and a digitally adjustable tuning arrangement which is connected to the output of the local oscillator and contains a frequency divider with numerically adjustable division ratio, a device for digitally adjusting the frequency divider, and a frequency comparator developing at its output, in the vicinity of a fixed reference frequency, a dc voltage dependent on the input frequency.

The ever increasing number of transmitters and the more and more closely spaced transmitter frequencies necessitate more accurate tuning in the receivers. Analogously operating, continuously adjustable tuning arrangements, particularly of the kind used in radio and television receivers so far, increasingly fail to meet these requirements and this so much the more if these tuning arrangements are operated by unskilled persons, which is generally the case with radio and television receivers. With digitally adjustable tuning devices, however, if the tuning data, e.g. the transmitter frequency, is known, the tuning operations can be performed by any unskilled person with ease and the necessary accuracy.

Superheterodyne receivers of the kind referred to above are known in the art. The output of the local oscillator for the mixer in the information transmission circuit of the known receiver is followed by a preselection counter organized in decades and operating as a digitally adjustable frequency divider whose division ratio is adjusted with a stepping switch. The output frequency of the frequency divider is fed to a phase-comparison discriminator in which it is compared with the frequency of a reference oscillator.

The local oscillator is controlled with the tuning voltage generated by the frequency deviation. A considerable disadvantage of this known tuning arrangement is that the control voltage of the discriminator is simultaneously the tuning voltage for the local oscillator. Thus, accurate frequency setting is achieved only in the center of the adjustable frequency range, while at the ends, particularly at the higher-frequency end of the frequency range, major deviations from the nominal frequency occur because of the control-voltage response.

SUMMARY OF THE INVENTION

It is an object of the present invention to provide a superheterodyne receiver having a simple, digitally adjustable tuning arrangement which does not have the aforementioned disadvantages and permits wide adjustable frequency ranges and in which nearly no deviation from the adjusted or actual frequency of the selected transmitter occurs over the entire adjustable frequency range.

According to a broad aspect of the invention there is provided an improved superheterodyne receiver wherein there is provided an information-transmission circuit, a local oscillator tunable with a dc voltage, a digitally adjustable tuning arrangement coupled to the output of said local oscillator and containing a frequency divider having a numerically adjustable division ratio, a device for digitally adjusting the frequency divider, and a frequency comparator having a dc voltage output which is dependent on the input frequency and approximates a fixed reference frequency, wherein the improvement comprises: an automatic tuning control circuit within said tuning arrangement having an input coupled to the output of said frequency comparator and having an output which provides a tuning voltage coupled to the tuning input of said local oscillator.

A preferred embodiment of the invention is characterized in that the automatic tuning control circuit contains a storage capacitor, a constant current source, a threshold switch, and a controllable resistance connected in parallel with the storage capacitor and formed by a transistor, and that the base of the transistor is connected to the output of the frequency comparator.

The digitally adjustable tuning arrangement of a superheterodyne receiver can be designed in a particularly simple manner using inexpensive, commercially available electrical components if the automatic frequency control output of a demodulator in the information transmission arrangement is connected to the automatic frequency control input of the local oscillator or to the automatic tuning control circuit.

The use of simple, well-known automatic tuning control circuits and simple, commercially available discriminators is of particular advantage in the manufacture and sale of radio and television receivers whose manufacturing costs are to be as low as possible. Another, essential advantage is the ease of operation of such receivers, especially that they can be adjusted independently of local receiving conditions, and that the incoming signal may be used to automatically readjust the receiver. In addition, wide setting ranges with an invariably high tuning accuracy are achieved with the invention.

The above and other objects of the present invention will be better understood from the following detailed description taken in conjunction with the accompanying drawings, in which:

BRIEF DESCRIPTION OF THE DRAWINGS

FIG. 4 shows another embodiment of a superheterodyne receiver according to the invention with a digitally adjustable tuning arrangement;

FIG. 5a is a diagram showing a single-hump output characteristic of the comparator used in FIG. 4, and FIG. 5b is a diagram showing a characteristic of the automatic frequency control voltage of a demodulator and the automatic frequency control characteristic of a local oscillator.

DESCRIPTION OF THE PREFERRED EMBODIMENTS

Figure 1:
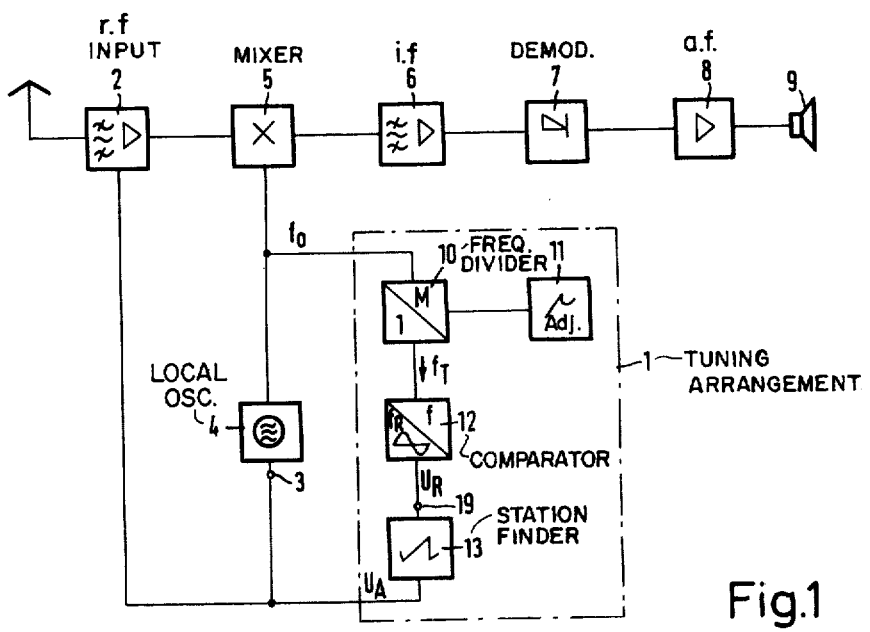
FIG. 1 is a block diagram of an information transmission circuit and a digital tuning arrangement of a superheterodyne receiver according to the invention.

FIG. 1 is a schematic block diagram showing one embodiment of a superheterodyne receiver according to the invention. The superheterodyne receiver contains a tuning arrangement 1, a local oscillator 4 which is voltage-controlled at its tuning input 3, and an information transmission circuit comprising an r.f. input circuit 2, a mixer 5, an i.f. circuit 6, and a demodulator 7. Connected to the output of the demodulator 7 is, for example, the a.f. unit 8 with the loudspeaker 9 of a radio receiver. The tuning arrangement 1 comprises a frequency divider 10 with a digitally adjustable division ratio, an adjusting device 11, a frequency comparator 12, and an automatic tuning control circuit 13.

With the adjusting device 11, which is digitally adjustable by hand, the division ratio (e.g. 1:M) in the frequency divider 10 is adjusted. After every M oscillations of the local oscillator, which oscillates at the frequency $f_o$, a signal is developed at the output of the frequency divider. In the frequency comparator, the frequency $f_T$ of this signal sequence is compared with a reference frequency $f_R$ which is permanently set there. If the divider frequency $f_T$ lies near the reference frequency, the frequency comparator develops at its output a signal whose magnitude and direction depend on the frequency deviation and which in case of equality has, for example, either a maximum of a hump or a zero crossing between a positive and a negative hump.

Figure 2:
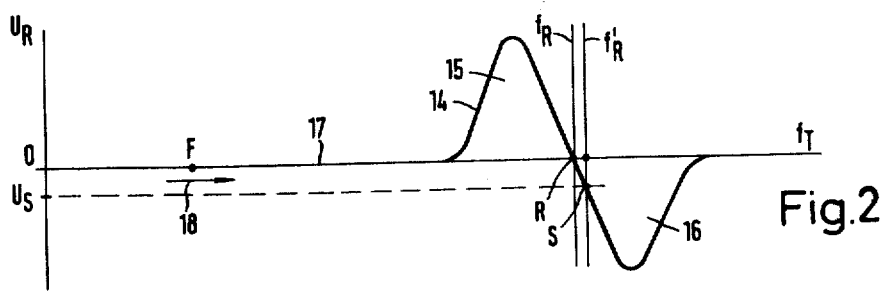
FIG. 2 is a diagram showing the output characteristic $U_R = f(f_T)$ of a frequency comparator.

The diagram of FIG. 2 shows the voltage curve 14 of an output signal of a frequency comparator which signal has a zero crossing R between a positive (15) and a negative (16) hump at the reference frequency $f_R$ on the axis 17 for the divider frequency $f_T$.

The automatic tuning control circuit 13 generates at its output, in known manner, a dc voltge $U_A$ (sawtooth or delta voltage) which rises between a minimum and a maximum and is applied to the input 3 of the voltage-controlled local oscillator 4, whose frequency $f_o$ is thus caused to vary continuously. The divider frequency $f_T = f_o/M$, shown in FIG. 2 by the traveling point F, varies in the same measure. During a search, the frequency point F moves in the direction of the arrow 18 along the voltage curve 14, which extends outside the humps 15, 16 on the frequency axis 17.

In the region of the humps the output signal 14 of the frequency comparator stops the search of the automatic tuning control circuit, whose input 19 is connected to the output of the frequency comparator, and retains the tuning voltage $U_A$, developed at the output of the automatic tuning control circuit, at the stop level. For example, the automatic station search is stopped by a low negative voltage $U_S$ at the input of the automatic tuning control circuit. In the example shown this is the case if the frequency point F reaches the point S on the voltage curve 14 of the comparator output signal. The stop voltage $U_S$ can be adjusted to be so low in relation to the hump height that the oscillator frequency $f'_o = M \cdot f'_R$, which is set at this point S, differs only slightly from the nominal frequency $f_o = M \cdot f_R$, to be set in the local oscillator.

Figure 3:
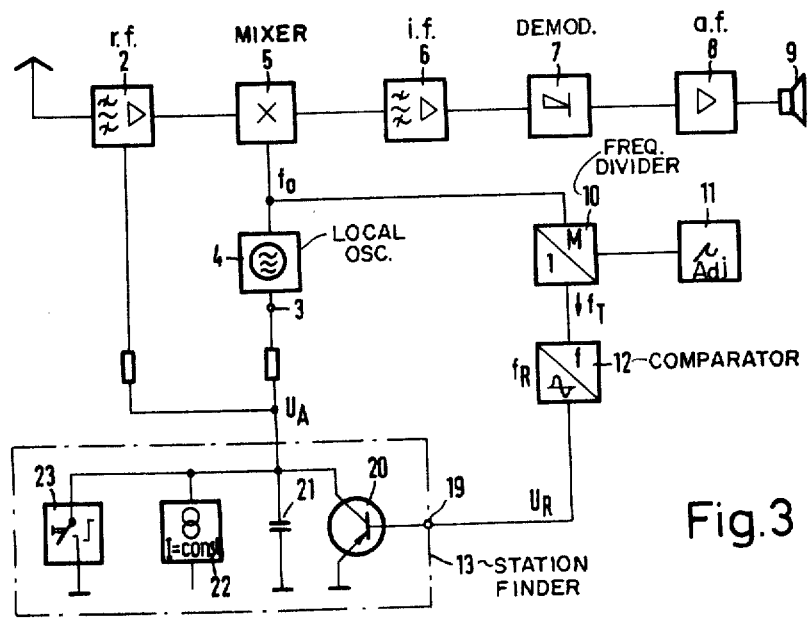
FIG. 3 is a schematic block diagram of an automatic tuning control circuit in a superheterodyne receiver according to the invention.

For example, the frequency point F on the voltage curve 14 of the frequency-comparator output signal controls a transistor 20 which, in an automatic tuning control circuit 13 as shown schematically in FIG. 3, is connected in parallel with a storage capacitor 21. The well-known automatic tuning control circuit 13 forms part of a superheterodyne receiver which is also shown in the block diagram of FIG. 3 and essentially corresponds to that of FIG. 1. The storage capacitor 21 is charged from a simple constant current source 22 and discharged by a threshold switch 23 above a tuning voltage $U_{Amax}$ exceeding the tuning range. The sawtooth voltage across the storage capacitor is the tuning voltage $U_A$ for the local oscillator 4 and for the tuned circuits in the r.f. receiving circuit 2 and determines the instantaneous position of the frequency point F in the diagram of FIG. 2. If the frequency point F is moving between the points R and S of the voltage curve 14 toward the point S, the transistor 20 is gradually rendered conductive and receives at the point S the entire current from the constant current source. The frequency point F locks in at the stop point S and thus maintains the tuning voltage $U_A$ for the oscillator frequency $f'_o = M \cdot f'_R$ constant.

For the frequency comparator 12, both commercially available frequency discriminators and phase comparison discriminators having a reference oscillator such as a crystal oscillator connected to their second input may be used, for example. The frequency discriminator may be designed in the same manner as the demodulator 7 in the transmission path of the receiver for frquency-modulated transmission frequencies. Accordingly, any of the known automatic tuning control circuits can be used for the tuning arrangement according to the invention, i.e. those, for example, which are both stopped and automatically controlled or those which are only stopped. It is also possible to stop the automatic tuning control circuit with the output signal of the frequency comparator 12 and to automatically control its output voltage $U_A$ or the local oscillator with an output voltage of the demodulator 7 which is used as an automatic frequency control voltage $U_N$. Particularly in case of automatic frequency control, no stringent requirements must be imposed on the automatic tuning control circuit as far as the tuning characteristic or voltage stability is concerned.

In the embodiment of a superheterodyne receiver according to the invention which is shown in FIG. 4, the output signal of the frequency comparator 12 in the tuning arrangement 1 is a single-hump dc-voltage curve 24 which has a maximum if the divider frequency $f_T$ is equal to the reference frequency $f_R$, and which is shown in the diagram of FIG. 5a on the axis 25 of the divider frequency $f_T$. During the search of the automatic tuning control circuit 13, a point F which represents the frequency $f_o = M f_T = f(U_A)$ set in the local oscillator by the, e.g., sawtooth-shaped tuning voltage $U_A$, travels in the direction of arrow 26 along the dc-voltage curve 24, which extends outside the hump 27 on the frequency axis 25. If the voltage curve exceeds, e.g. in the point S, a threshold value $U_S$ of the input 19 of the automatic tuning control circuit, the search is stopped, the tuning voltage $U_A$ at the output of the automatic tuning control circuit thus being kept constant. Accordingly, a frequency $f'_o = M f'_R$, corresponding to the point S, is set in the local oscillator 4.

In the embodiment shown in FIG. 4, the local oscillator 4 has an automatic frequency control input for a voltage-controlled afc element 28, preferably a varactor. This automatic frequency control input is connected via a line 29 to the afc output 30 of the demodulator 7 in the transmission channel comprising the blocks 2 and 5 to 9. At the afc output 30, in case of deviations of the intermediate frequency $f_Z$ from the frequency $f_D$ permanently set in the demodulator, dc voltages $U_N$ are developed whose dependence on the intermediate frequency $f_Z$ is shown, by way of example, by the voltage curve 31 in the diagram of FIG. 5b. The scale of the frequency axes 25 and 32 in both diagrams is such that the two reference points $R_T$ and $R_Z$ are located at the same distance from the zeros of the coordinate systems. Then, the automatic frequency control characteristic 33 of the local oscillator 4, which characteristic is referenced to the frequency axis 32, intersects the frequency axis 32 at the point S', which corresponds to the stop point S of diagram 5a, and the curve 31 of the afc voltage at the point S'', to which corresponds the local-oscillator frequency $f''_o = m \cdot f''_R$ of the diagram of FIG. 5a.

By controlling the frequency of the local oscillator 4 or of the automatic tuning control circuit 13 with an afc voltage from the demodulator 7, frequency deviations of the transmitter frequency or of the reference frequency can be compensated for, so that, in this case, no very exacting requirements must be imposed even on the stability of the reference frequency of the frequency comparator, so that simple, commercially available frequency discriminators may be used for the frequency comparator.

The adjusting device 11 may be designed so that it can be used to select the frequencies of the stations to be received, or it may be designed as a channel selector or constituted so that it can be used to select permanently programmed stations or stations which can be read in and out.

What is claimed is:

1. An improved superheterodyne receiver wherein there is provided an information-transmission circuit, a local oscillator tunable with a dc voltage, a digitally adjustable tuning arrangement coupled to the output of said local oscillator and containing a frequency divider having a numerically adjustable division ratio, a device for digitally adjusting the frequency divider, and a frequency comparator having a dc voltage output which is dependent on the input frequency and approximates a fixed reference frequency, wherein the improvement comprises:

an automatic tuning control circuit within said tuning arrangement having an input coupled to the output of said frequency comparator and having an output which provides a tuning voltage coupled to the tuning input of said local oscillator, said automatic tuning circuit comprising:
a storage capacitor;
a constant current source;
a threshold switch; and
a controllable resistance coupled in parallel with said storage capacitor and formed by a transistor having base emitter and collector electrodes, said emitter electrode coupled to ground, said collector electrode coupled to said storage capacitor, and said constant current source, and said threshold switch, and said base electrode coupled to the output of said frequency comparator.

2. A superheterodyne receiver according to claim 1 wherein said tuning voltage is further coupled to the resonant circuits of the information transmission circuit.

3. A superheterodyne receiver according to claim 1 further including a demodulator having an automatic frequency control output in the information transmission arrangement coupled to the automatic frequency control input of said local oscillator.

* * * * *